United States Patent [19]

Gulczynski

[11] Patent Number: 4,958,155

[45] Date of Patent: Sep. 18, 1990

[54] ULTRA FAST DIGITAL-TO-ANALOG CONVERTER WITH INDEPENDENT BIT CURRENT SOURCE CALIBRATION

[76] Inventor: Zdzislaw Gulczynski, P.O. Box 441, Winchester, Mass. 01890

[21] Appl. No.: 304,507

[22] Filed: Jan. 31, 1989

[51] Int. Cl.$^5$ .................. H03M 1/10; H03M 1/06
[52] U.S. Cl. .................................. 341/120; 341/118; 341/144
[58] Field of Search ............ 341/118, 120, 119, 126, 341/133, 136, 144, 150, 153, 154

[56] References Cited

U.S. PATENT DOCUMENTS

| | | | |
|---|---|---|---|
| 4,222,107 | 9/1980 | Mrozowski et al. | 341/120 |
| 4,340,882 | 7/1982 | Maio et al. | 341/118 |
| 4,405,916 | 9/1983 | Hornak et al. | 341/118 |
| 4,565,961 | 1/1986 | Hornak et al. | 341/118 |
| 4,591,828 | 5/1986 | Storey | 341/120 |
| 4,607,250 | 8/1986 | Naylor et al. | 341/118 |
| 4,835,535 | 5/1989 | Shibayama | 341/120 |

*Primary Examiner*—William M. Shoop, Jr.
*Assistant Examiner*—H. L. Williams

[57] ABSTRACT

Ultra fast high resolution digital-to-analog converter converts input code into a corresponding output current or voltage. The individual currents are continuously adjusted and coupled to an output via switches. Resistors can have two values. On-resistances of any switches and values of capacitors are insignificant. No transistor matching is necessary, wherein FETs are preferred.

Current sources provide currents in a response to base signals stored in the capacitors. The resistors conduct the currents and switches couple the currents to the output in response to the input code. A reference circuit provides a reference code and reference signal corresponding thereto. A multiplexer selects a voltage appearing across one of the resistors, in response to the reference code. A comparator compares the selected voltage against reference signal and provides a corrective signal. A demultiplexer applies the corrective signal to one of the capacitors in response to the reference code.

18 Claims, 3 Drawing Sheets

ULTRA FAST DIGITAL-TO-ANALOG CONVERTER WITH INDEPENDENT BIT CURRENT SOURCE CALIBRATION

CROSS REFERENCE TO RELATED INVENTIONS

This application is related to:

"Ultra Fast Logic with Temperature Compensation and Minimized Supply Voltage" Ser. No. 474,489 filed Feb. 2, 1990;

"Dual Flash Analog-to-Digital Converter" Ser. No. 316,592 filed Feb. 24, 1989;

"Dual Flash Analog-to-Digital Converter" Ser. No. 316,593 filed Feb. 24, 1989;

"Dual Flash Analog-to-Digital Converter" Ser. No. 316,594 filed Feb. 24, 1989;

"Ladderless True Flash Analog-to-Digital Converter with Automatic Calibration" Ser. No. 304,505 filed Jan. 31, 1989 herewith;

"Segmented Encoder and Digital Memory Particularly for Flash Analog-to-Digital Converters" Ser. No. 304,506 filed Jan. 31, 1989 herewith;

"High Power Switching Power Supply with High Power Factor" Ser. No. 304,508 filed Jan 31, 1989 herewith;

"High Power Switching Power Supply Having High Power Factor" Ser. No. 304,509 filed Jan. 31, 1989 herewith;

"High Accuracy Reference Ladder" Ser. No. 304,510 filed Jan. 31, 1989 herewith;

"High Speed Integrating Analog-to-Digital Converter" Ser. No. 251,171 filed July 30, 1988;

"Flash Analog-to-Digital Converter with Integrating Input Stage" Ser. No. 248,495 filed Sept. 22, 1988;

"Encoder with Error Correction Particularly for Flash Analog-to-Digital Converters" Ser. No. 225,240 filed July 28, 1988;

"Sample-and-Hold Amplifier with Controllable Source Charger" Ser. No. 201,071 filed May 27, 1988;

"High Speed Integrating Digital-to-Analog Converter" Ser. No. 198,110 filed May 23, 1988;

"Ultra Fast Logic" Ser. No. 180,431 filed Apr. 12, 1988;

"High Speed Instrumentation Amplifier with Minimized Offset Voltage and Drift" U.S. Pat. No. 4,829,263 dated May 9, 1989;

"Digital-to-Analog Converter with Digital Correction" U.S. Pat. No. 4,843,392 dated June 27, 1989;

"Flash Analog-to-Digital Converter" U.S. Pat. No. 4,763,106 dated Aug. 9, 1988;

"Dual Flash Analog-to-Digital Converter" U.S. Pat. No. 4,857,931 dated Aug. 15, 1989;

"Digital-to-Analog Converter" U.S. Pat. No. 4,811,017 dated Mar. 7, 1989;

"Digital-to-Analog Converter" U.S. Pat. No. 4,837,572 dated June 6, 1989;

"Operational Amplifier or Comparator Circuit with Minimized Offset Voltage and Drift" U.S. Pat. No. 4,749,953 dated June 7, 1988; and "Push-Pull Power Amplifier" U.S. Pat. No. 4,476,441 dated Oct. 9, 1984.

All inventions are by the same inventor.

BACKGROUND OF THE INVENTION

The invention relates to a digitalto-analog converter (DAC), particularly for systems requiring an ultra fast high resolution conversion of a digital input code into a corresponding analog output current or voltage.

Conventional DACs comprise a switch matrix controlled by the digital input code, and an associated resistor network which is used for obtaining binary weighted partial currents or voltages for a further adding in a summing unit. The partial currents are obtained by current sources each coupled to the summing unit directly or via a separate switch. The summing unit may also comprise an additional resistor network. The accuracy of the current sources practically determines the accuracy of the DAC. Furthermore, the switch on-resistance, linearity, temperature coefficient, etc. are insignificant. An output amplifier is necessary for obtaining a voltage proportional to the input code.

The DACs employing the resistor network for obtaining binary weighted voltages use switches having precisely matched characteristics as the on-resistance thereof is added to selected resistances of the resistor network. A constant voltage drop across every closed switch must be maintained. However, the circuit structure is fairly simple as the reference voltage is directly divided by the resistor network.

Several designs combine good and bad features of both techniques described above. For instance, commonly known quad current source approach is based on binary weighted current sources, in groups of four. Parts of the circuit are repetitive which makes easier a monolithic integration. For instance, three such quads provide a 12 bit resolution. The circuit still requires current sources operating with three different currents and two accurately trimmed resistor networks with low temperature coefficients.

The disadvantages of conventional DACs are many. The binary weighted currents or voltages employ respectively precisely matched switches or transistors of the current sources. Specific serial and/or parallel connections of the actually resistive switches or the current sources are often necessary for matching respective parameters and their temperature coefficients. As a result the monotonicity is difficult to achieve and the long term stability is poor. The parasitic capacitances as well as switching delays of the analog switches cause high transient voltage spikes. The output impedance of the DACs is limited and often depends on the input code. This must be considered in an output amplifier.

SUMMARY OF THE INVENTION

The invention is intended to provide a very high resolution DAC having a current or voltage output and extremely high conversion speed. The very high resolution is accomplished as the individual currents are continuously adjusted. The extremely high conversion speed is accomplished as switches and output amplifier are the only components carrying a high frequency signal. Moreover, voltages across open switches are minimal. Resistors can have two values. On-resistances of any switches and values of capacitors are insignificant. No transistor matching is necessary, wherein FETs are preferred.

DAC according to the present invention converts input code into output signal and comprises a plurality of capacitive means for storing base signals, a reference means for providing a reference code and reference signal corresponding thereto, a multiplexer means for selecting the input code or reference code, a plurality of current source means for providing the output signal in response to the base signals and to code selected by the multiplexer means, a comparator means for comparing the output signal against reference signal and providing a corrective signal, and a demultiplexer means for applying the corrective signal to one of the capacitive means in response to the reference code.

In another embodiment the DAC comprises a plurality of capacitive means for storing base signals, a plurality of current source means for providing currents in a response to the base signals, a switch means for coupling the currents to the output signal in response to the input code, a plurality of resistive means for conducting the currents and providing signals in response thereto, a reference means for providing a reference code and reference signal corresponding thereto, a multiplexer means for selecting one of the resistive means signals in response to the reference code, a comparator means for comparing the resistive means signal selected by the multiplexer means against reference signal and providing a corrective signal, and a demultiplexer means for applying the corrective signal to one of the capacitive means in response to the reference code.

In yet another embodiment the reference means includes a resistive means for providing a plurality of second reference signals, and a second multiplexer means for selecting one of the second reference signals in response to the reference code.

BRIEF DESCRIPTION OF THE DRAWINGS

The present invention will become more clear in conjunction with the accompanying figures throughout which similar references denote similar parts and of which.

DETAILED DESCRIPTION OF THE INVENTION

Figure 1:
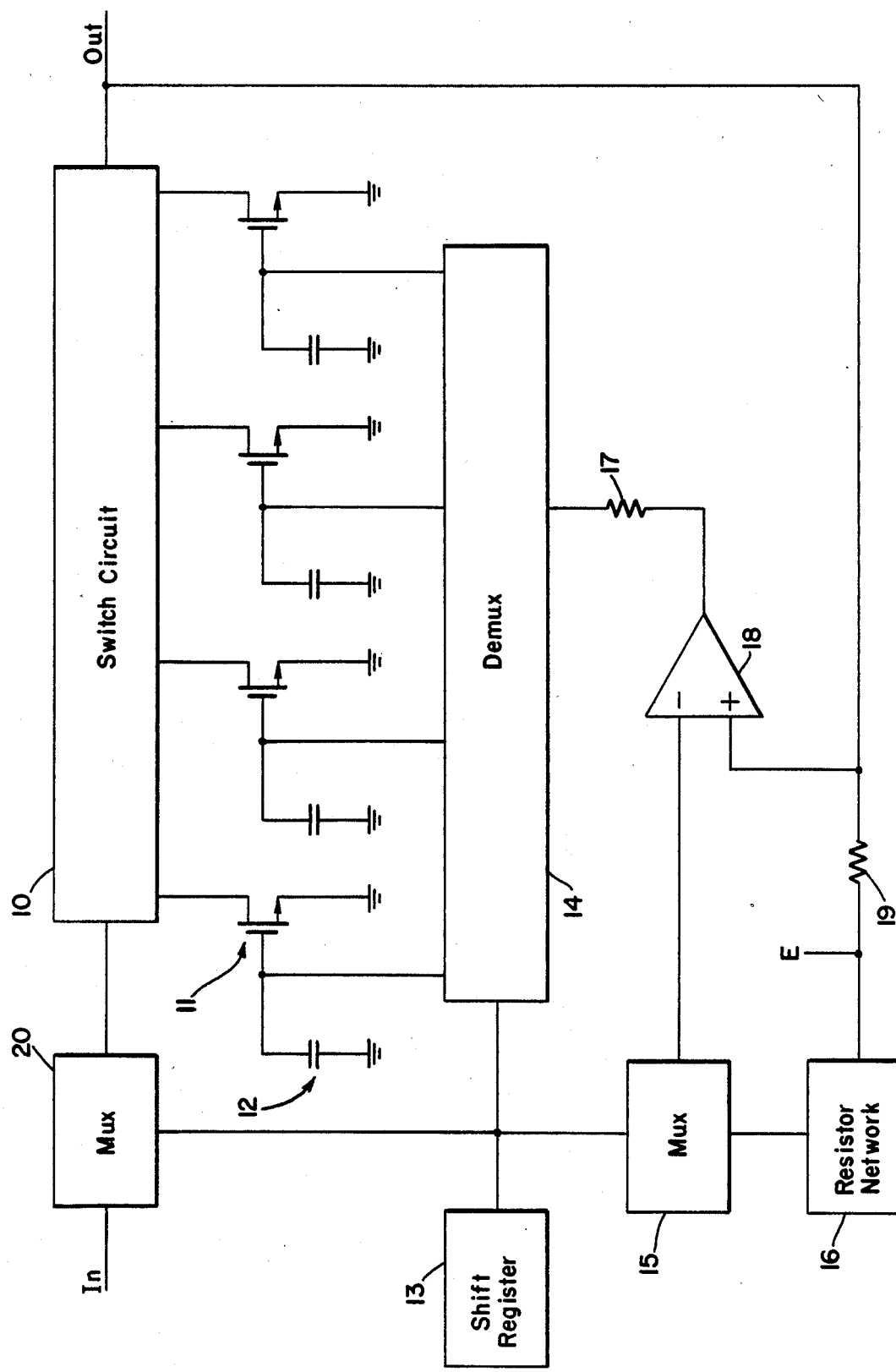
FIG. 1 is an embodiment of 4-bit DAC with direct output current sensing.

FIG. 1 is an embodiment of 4-bit DAC with direct output current sensing. The DAC comprises a plurality of controllable current sources for providing an output signal in response to base signals and to code selected by the multiplexer 20. Specifically, the transistors 11 and switch circuit 10 constitute the current sources. The transistors 11 provide drain currents in response to base voltages and switch circuit 10 couples the drain currents to the DAC output in response to the selected code. Each of the transistors 11 has a gate, drain and source coupled to one of the capacitors 12, switch circuit 10 and ground respectively. Each of the capacitors 12 is also coupled to ground and stores the respective base voltage.

The drains of the transistors 11 can be directly coupled to the DAC output. The drain current switching can be accomplished by employment of switches disconnecting the gates or sources of the transistors 11. Subsequently, the gates and sources of the individual transistors 11 can be tied together. FETs can be employed as the transistors 11, e.g. MOSFETs, MESFETs, JFETs. Bipolar transistors are not recommended due to huge base currents thereof.

The DAC also comprises a reference means for providing a reference code and reference signal corresponding thereto.

Specifically, the shift register 13 has a clock oscillator and provides the reference code. The multiplexer 20 selects the input code or reference code. In response to the selected code the switch circuit 10 couples the drain currents of the transistors 11 to the DAC output. The resistor network 16 is coupled to the voltage E and provides a plurality of reference voltages. The multiplexer 15 selects one of the reference voltages in response to the reference code.

The comparator 18 has a pair of inputs for comparing signals applied thereacross, and produces a corrective signal. Specifically, the noninverting and inverting inputs of the comparator 18 receive the DAC output voltage and reference voltage provided by the multiplexer 15 respectively. The demultiplexer 14 applies the corrective signal to one of the capacitors 12 in response to the reference code. As a result, the base voltages across the capacitors 12 are adjusted one at a time. The resistor 17 is coupled in series with the comparator 18 for limiting the current charging the capacitors 12. The resistor 19 is coupled between the voltage E and noninverting input of the comparator 18 for biasing the transistors 11 and obtaining a voltage in response to the current provided by the switch circuit 10.

The switch circuit 10 includes switches coupled between the drains of the transistors 11 and DAC output. For the input code conversion, the multiplexer 20 selects the input code, whereby any of the switches can be open or closed at the same time. For the adjustment of the base voltages, the multiplexer 20 selects the reference code. The drain current of only one of the transistors 11 is coupled to the DAC output since the reference code provided by the shift register 13 has a single 1 which actuates only one switch. The complexity of the demultiplexer 14 and multiplexer 15 is significantly reduced as the switches thereof are directly controlled by the reference code. Any decoder is superfluous.

The operation of the DAC will become more clear by analyzing an example of the 4-bit DAC. For the purpose of clarity, 1 least significant bit of the DAC input or reference code corresponds to 1mA of the total current provided by the switch circuit 10. This current is applied to the resistor 19 whose value may be 1kohm. The voltage E may be equal 16V. During the adjustment of the base voltages, the shift register 13 provides the reference code which has a single 1. The drain current of one of the transistors 11 is applied to the DAC output and resistor 19. The comparator 18 provides the corrective signal which is applied to one of the capacitors 12 coupled to the gate of the same transistor.

For instance, if the reference code is 0001, the reference voltage provided by the multiplexer 15 is $E - 1V = 15V$. The gate-source voltage of one transistor is adjusted to such a value that the drain current thereof is 1mA, whereby the voltage drop across the resistor 19 is 1V. For the reference codes equal 0010, 0100 and 1000, the reference voltages provided by the multiplexer 15 are 14V, 12V and 8V respectively. The drain currents of remaining transistors are adjusted to 2mA, 4mA and 8mA respectively. The gate-source voltages of the transistors 11 which result in the respective drain currents are stored in the capacitors 12.

For the input code conversion, the reference code is equal 0000. Any switch of the demultiplexer 18 is open, whereby no recharging of the capacitors 12 takes place.

The multiplexer 20 selects the input code. The total current provided by the transistors 11 applied to the DAC output varies in range 0 to 15mA. Consequently, the voltage appearing at the DAC output varies in range 1V to 16V and is proportional to the current.

Figure 2:
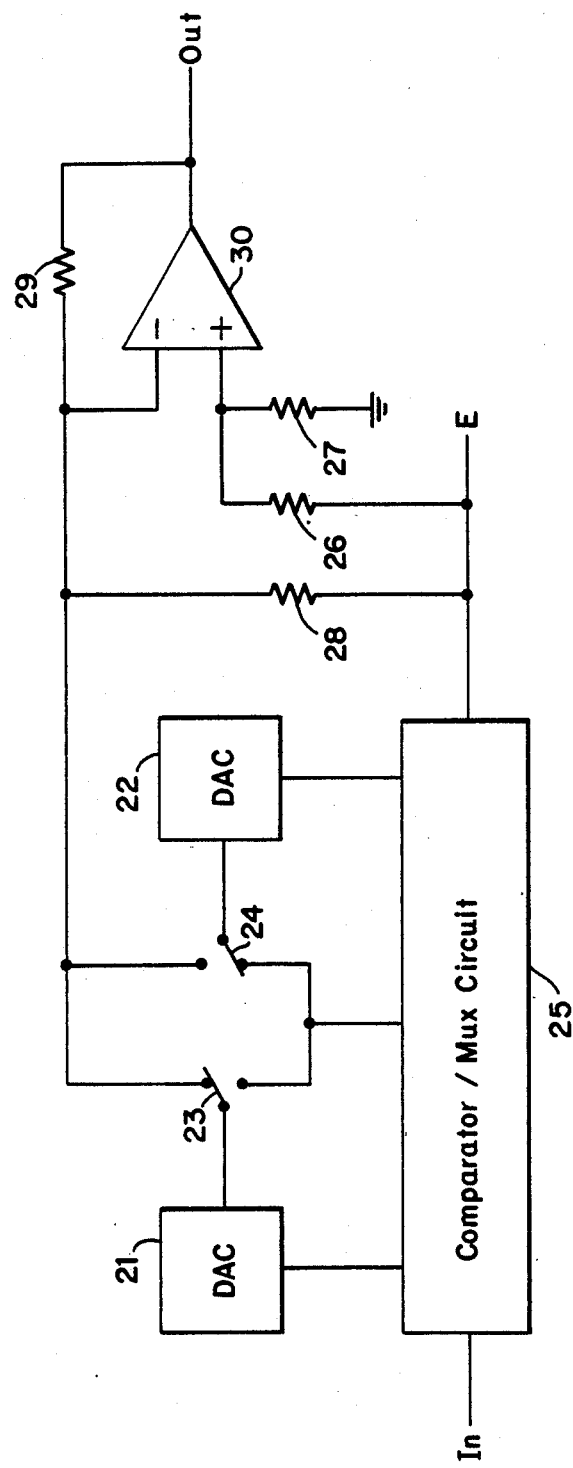
FIG. 2 is an embodiment of a DAC for uninterrupted conversion of the input code and with bipolar output.

FIG. 2 is an embodiment of a DAC for uninterrupted conversion of the input code and with bipolar output. The circuit comprises the DACs 21 and 22 each converting any code applied thereto into a current. The switch 24 and an inverting amplifier consisting of components 26 thru 30 are optional. In this simplified embodiment, the switch 23 operates as a multiplexer means for selectively coupling the output current of the DAC 21 to a comparator means of the circuit 25 or to output of the entire DAC. The output current of the DAC 22 is also coupled to the output. The DAC 22 performs the conversion of the input code into a current during the adjustment of base voltages of the DAC 21. Otherwise, the output current of the DAC 22 is zero.

In another embodiment, the multiplexer means includes the switch 24 for selectively coupling the output current of the DAC 22 to the comparator means of the circuit 25 or to inverting input of the operational amplifier (OA) 30. The switch 23 applies the output current of the DAC 21 to the inverting input. Simultaneously, the adjustment of base voltages of the DAC 22 takes place as the output current thereof is applied to the comparator means via the switch 24. The DACs 21 and 22 swap the functions when the switches 23 and 24 are switched.

The comparator/multiplexer circuit 25 comprises components coupled and operating as 13 thru 19 of FIG. 1. In particular, the comparator means comprises the components 15 thru 19 shown in FIG. 1. The comparator means selectively receives the output current of the DAC 21 or 22 while the reference code is applied thereto. The circuit 25 also includes a pair of multiplexers analogous to 20 of FIG. 1. The input code is applied to one DAC while the other DAC receives the reference code for adjustment of the base voltages. Consequently, a demultiplexer separately applies a corrective signal to capacitors storing the respective base voltages. By way of example, FIG. 2 shows the DACs 21 and 22 providing the output currents to the OA 30 and circuit 25 respectively.

The DACs 21 and 22 comprise components coupled and operating as 10 thru 12 of FIG. 1. In particular, switching circuits analogous to 10 of FIG. 1 are employed in DACs 21, 22 and are coupled to the respective outputs thereof. Thereby, the DACs 21 and 22 have high impedance current outputs. Moreover, the switches 23 and 24 are coupled in series therewith, whereby their on-resistances are insignificant.

The inverting amplifier has a low impedance bipolar output and amplifies the output signal of the DAC. Specifically, the resistor 29 is coupled between the inverting input and output of the OA 30. The noninverting input thereof is biased by the series coupled resistors 26 and 27 which divide down the reference voltage E. The inverting input is also coupled to the voltage E via the resistor 28. The voltage drop thereacross is fixed, whereby a predetermined current is applied to the inverting input. This result in a negative output offset voltage of the OA 30.

Consistent with the previous numeric example, the output currents of the DACs 21 and 22 may vary in range 0 to 15 mA while applied to the inverting input of the OA 30. The voltage E is 16V. If the values of the resistors 27 thru 29 are equal 1kohm and resistor 26 is 3kohms, the output voltage of the OA 30 will vary in range −8V to +7V.

Figure 3:
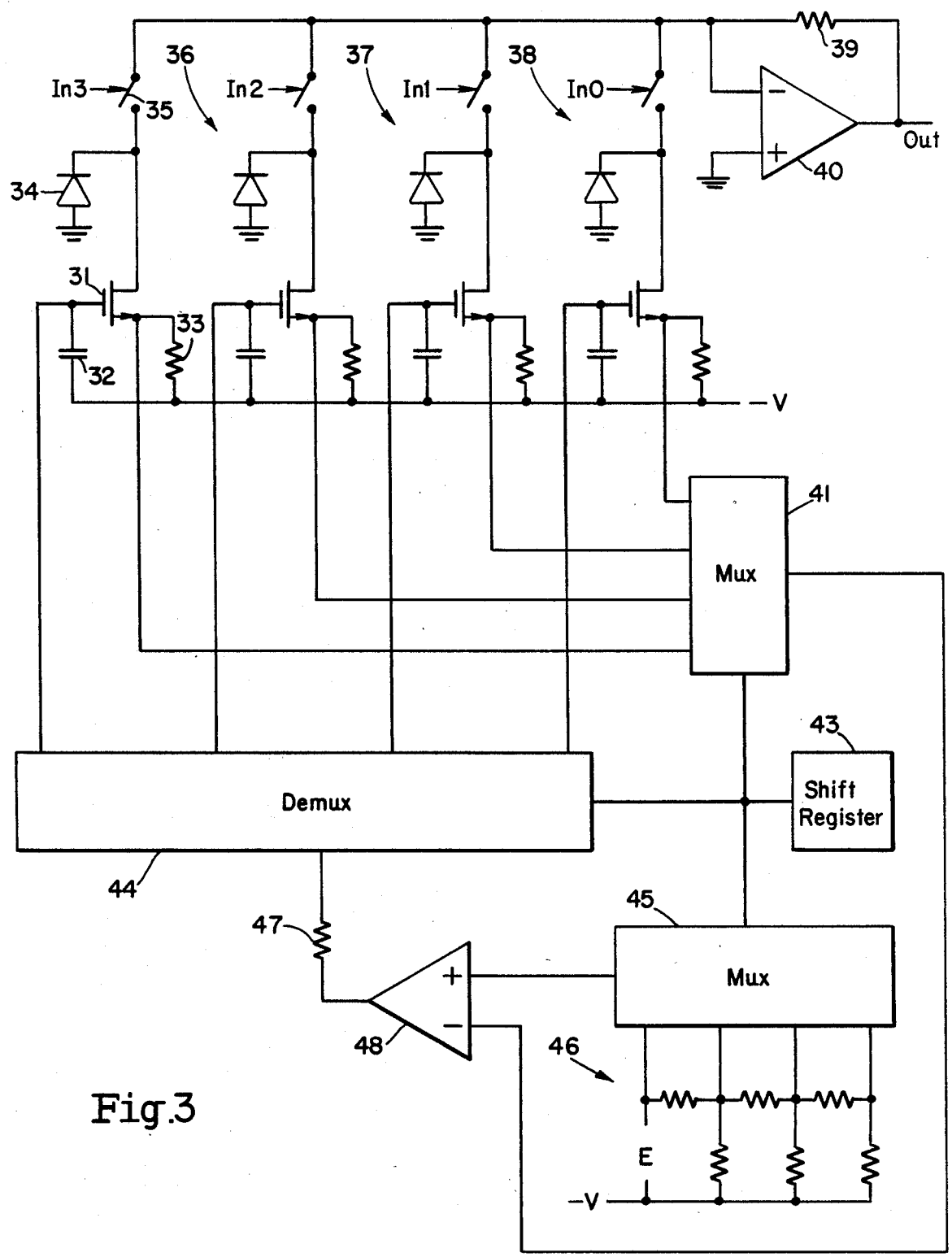
FIG. 3 is the preferred embodiment of 4-bit DAC simultaneously performing conversion and adjustment of base voltages.

FIG. 3 is the preferred embodiment of 4-bit DAC simultaneously performing conversion and adjustment of base voltages. The DAC comprises a plurality of current sources each providing a current. The sources are controlled by separate base signals stored in capacitors. A switch circuit applies the currents to an optional amplifier in response to the DAC input code. Resistors conduct the currents and provide voltages in response thereto. A reference circuit provides a reference code and reference signal corresponding thereto. The multiplexer 41 selects one of the resistor voltages in response to the reference code. The comparator 48 compares the selected voltage against reference signal and provides a corrective signal. The demultiplexer 44 applies the corrective signal to one of the capacitors in response to the reference code.

The 4-bit DAC comprises four identical blocks. Each block provides a current in response to one bit of the DAC input code, receives the corrective signal for adjusting the current and provides a voltage corresponding thereto. Specifically, the first block comprises the components 31 thru 35 and is responsive to the most significant bit of the DAC input code which bit is applied to the input In3. The remaining blocks 36 thru 38 are responsive to the less significant bits applied to the inputs In2, In1 and In0 respectively. All blocks are coupled between and supply voltage −V and input of the inverting amplifier.

The first block includes the controllable current source consisting of the transistor 31. The gate and source thereof are both coupled to the supply voltage −V via the capacitor 32 and resistor 33 respectively. The capacitor 32 stores the base voltage which determines the current provided by the drain of the transistor 31. The drain current also flows thru the resistor 33 and determines a voltage drop thereacross. FETs can be employed as the transistor 31 and remaining transistors. Bipolar transistors are not recommended due to huge base currents thereof.

The switch 35 is open or closed in response to the most significant bit of the DAC input code. The drain of the transistor 31 is coupled to the inverting input of the OA 40 and ground via the switch 35 and diode 34 respectively. The diode 34 is cut off when the switch 35 is closed as the inverting input of the OA 40 has ground potential. The noninverting input of the OA 40 is coupled to ground. The diode 34 conducts when the switch 35 is open, whereby the voltage across the current source is limited. Moreover, the voltage across the conducting diode 34 is very small. As a result, the drain-source voltage of the transistor 31 is practically fixed since the voltage across the resistor 33 is constant. The sum of the voltages is substantially equal V.

The components 43 thru 48 correspond to 13 thru 18 of FIG. 1 respectively. However, the resistor network 46 and voltage E are referenced to the negative supply voltage −V rather than ground. The reference circuit includes the shift register 43 which has a clock oscillator and provides the reference code. The reference circuit further includes multiplexer 45 and resistor network 46 which are optional. In this simplified embodiment, the reference signal is fixed and the voltage E−V is applied to the noninverting input of the comparator 48. In response to the reference code, the multiplexer 41 and demultiplexer 44 couple respectively source and gate of one transistor to the comparator 48.

Specifically, the multiplexer 41 couples the source of the transistor 31 to the inverting input of the comparator 48, whereby the voltage across the resistor 33 is compared against E. The comparison signal produced by the comparator 48 is applied via the resistor 47 and demultiplexer 44 to the capacitor 32. The voltage across the resistor 33 is adjusted to be equal E. Similarly, the base voltages and drain currents of the blocks 36 thru 38 are adjusted by altering the reference code. The value of the resistors determine the drain currents of the respective transistors. However, the resistors may have equal values when the multiplexer 45 and resistor network 46 are employed. The resistor network 46 provides a plurality of reference voltages. The multiplexer 45 selects one of the reference voltages in response to the reference code.

The DAC has a high impedance current output. The optional amplifier consists of the OA 40 and resistor 39 for amplifying output current and providing an output voltage. Specifically, the resistor 39 is coupled between the inverting input and output of the OA 40. The noninverting input thereof is coupled to ground. The DAC output voltage is equal to a voltage drop across the resistor 39 as a result of the current applied to the inverting input of the OA 40. Also an amplifier as shown in FIG. 2 can be employed for attaining a bipolar output.

The operation of the DAC will become more clear by analyzing an example of the 4-bit DAC, analogous to previous numeric examples. The voltage E may be equal 1V. In the simplified embodiment, the reference voltage is fixed and equal 1V with reference to −V. The values of the resistor 33 and resistors of the blocks 36 thru 38 are ⅛kohm, ¼kohm, ½kohm and 1 kohm respectively. The drain currents of the transistors coupled to the resistors are 8 mA, 4 mA, 2 mA and 1 mA respectively. The same values of the drain currents can be obtained when the resistor values are ⅛kohm. The voltages provided by the resistor network 46, with reference to −V, are equal 1V, ½V, ¼V and ⅛V respectively.

The network 46 is an ordinary R-2R resistor ladder for providing binary weighted reference voltages. The capacitors and resistors coupled to the transistors are referenced to −V. Consequently, the network 46 is coupled between the reference voltage E and supply voltage −V. The voltage E is also one of the reference voltages. The network consists of a chain of R-R voltage dividers so that the voltage E is successively divided by two. The resistors coupled to two other resistors and −V have value 2R. The remaining four resistors have value R. The resistor network 46 and multiplexer 45 can be simplified when the resistors coupled to sources of the transistors have unequal values. The resistor network can be completely eliminated thru employment of a reference ladder disclosed in the abovementioned "High Accuracy Reference Ladder" filed on even date herewith, by the same inventor.

The value of the supply voltage −V is not essential and may vary in a large range. On-resistances of any switches and capacitors employed in the DAC are insignificant. The drain currents are continuously adjusted, whereby a very high resolution can be accomplished. The drain-source voltages of the transistors are virtually fixed. Moreover, the maximum voltage across the switches coupled in series with the drains is limited by the conducting diodes to a very small value. No weighting of the drain currents takes place as the switches are directly coupled to the inverting input of the OA 40. The inverting mode thereof is most advantageous. The switching speed of the DAC is extremely high.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Digital-to-analog converter for converting input code into output signal, comprising:
   a plurality of capacitive means for storing base signals;
   a reference means for providing a reference code and reference signal corresponding thereto;
   a multiplexer means for selecting the input code or reference code;
   a plurality of current source means for providing the output signal in response to the base signals and to code selected by the multiplexer means;
   a comparator means for comparing the output signal against reference signal and providing a corrective signal; and
   a demultiplexer means for applying the corrective signal to one of the capacitive means in response to the reference code.

2. Digital-to-analog converter of claim 1 wherein the reference means includes a shift register means for providing the reference code.

3. Digital-to-analog converter of claim 1 wherein the reference means includes:
   a resistive means for providing a plurality of second reference signals; and
   a second multiplexer means for selecting one of the second reference signals in response to the reference code.

4. Digital-to-analog converter of claim 1 wherein the current source means provide currents, and
   further wherein the current source means include switch means for coupling the currents to the output signal in response to the code selected by the multiplexer means.

5. Digital-to-analog converter of claim 1 wherein at least one current source means includes a transistor having a gate coupled to the base signal, and a drain providing a current.

6. Digital-to-analog converter of claim 1 further including:
   a second multiplexer means for selectively coupling the current source means to the first said output signal or comparator means; and
   a second digital-to-analog converter means for converting the input code into a second output signal, wherein the second output signal is coupled to the first said output signal.

7. Digital-to-analog converter of claim 6 wherein the second multiplexer means selectively couples the second output signal to the comparator means or first said output signal.

8. Digital-to-analog converter of claim 1 further including an amplifier means for amplifying the output signal.

9. Digital-to-analog converter of claim 8 wherein the amplifier means includes:
   an inverting input and output; and a resistive means for coupling the inverting input to the output of the amplifier means.

10. Digital-to-analog converter for converting input code into output signal, comprising:
 a plurality of capacitive means for storing base signals;
 a plurality of current source means for providing currents in a response to the base signals;
 a switch means for coupling the currents to the output signal in response to the input code;
 a plurality of resistive means for conducting the currents and providing signals in response thereto;
 a reference means for providing a reference code and reference signal corresponding thereto;
 a multiplexer means for selecting one of the resistive means signals in response to the reference code;
 a comparator means for comparing the resistive means signal selected by the multiplexer means against reference signal and providing a corrective signal; and
 a demultiplexer means for applying the corrective signal to one of the capacitive means in response to the reference code.

11. Digital-to-analog converter of claim 10 wherein at least one current source means includes a transistor having a gate coupled to the base signal, and a drain providing the respective current.

12. Digital-to-analog converter of claim 11 wherein the transistor has a source coupled to one of the resistive means.

13. Digital-to-analog converter of claim 10 wherein the switch means includes a plurality of diode means separately coupled to the current source means for limiting voltages thereacross.

14. Digital-to-analog converter of claim 10 further including a voltage source means for providing a voltage,
 wherein the capacitive and resistive means are coupled to the source means.

15. Digital-to-analog converter of claim 10 wherein the reference means includes a shift register means for providing the reference code.

16. Digital-to-analog converter of claim 10 wherein the reference means includes:
 a second resistive means for providing a plurality of second reference signals; and
 a second multiplexer means for selecting one of the second reference signals in response to the reference code.

17. Digital-to-analog converter of claim 10 further including an amplifier means for amplifying the output signal.

18. Digital-to-analog converter of claim 17 wherein the amplifier means includes:
 an inverting input and output; and
 a feedback resistive means for coupling the inverting input to the output of the amplifier means.

* * * * *